(12) United States Patent
Murtaza et al.

(10) Patent No.: US 11,545,969 B1
(45) Date of Patent: Jan. 3, 2023

(54) GATE-TO-SOURCE MONITORING OF POWER SWITCHES DURING RUNTIME

(71) Applicant: Infineon Technologies AG, Neubiberg (DE)

(72) Inventors: Cristian Murtaza, Bucharest (RO); Markus Zannoth, Neubiberg (DE); Peter Stemplinger, Madrid (ES)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/479,809

(22) Filed: Sep. 20, 2021

(51) Int. Cl.
| | |
|---|---|
| H03K 3/00 | (2006.01) |
| H03K 17/06 | (2006.01) |
| H03K 17/16 | (2006.01) |
| H03K 17/687 | (2006.01) |
| H03K 19/00 | (2006.01) |
| H03K 17/0412 | (2006.01) |

(52) U.S. Cl.
CPC ..... *H03K 17/063* (2013.01); *H03K 17/04123* (2013.01); *H03K 17/6877* (2013.01); *H03K 2017/066* (2013.01); *H03K 2217/0081* (2013.01)

(58) Field of Classification Search
None
See application file for complete search history.

(56) References Cited

U.S. PATENT DOCUMENTS

| | | | | |
|---|---|---|---|---|
| 6,271,709 B1* | 8/2001 | Kimura | ............... | H03K 17/168 |
| | | | | 327/434 |
| 6,545,513 B2* | 4/2003 | Tsuchida | .............. | H03K 17/166 |
| | | | | 327/108 |
| 8,729,929 B2* | 5/2014 | Kawamoto | .......... | H03K 17/063 |
| | | | | 327/108 |
| 10,651,723 B1* | 5/2020 | Frank | .................... | H03K 17/687 |
| 10,667,363 B1* | 5/2020 | Chen | ...................... | H05B 45/14 |
| 10,790,813 B2* | 9/2020 | Mukunoki | ....... | H03K 17/08128 |
| 10,790,818 B1* | 9/2020 | Frank | .................... | H03K 17/168 |
| 2022/0006416 A1* | 1/2022 | Song | ..................... | H02P 29/024 |

OTHER PUBLICATIONS

U.S. Appl. No. 17/479,724, filed Sep. 20, 2021, naming inventors Zannoth et al.

* cited by examiner

*Primary Examiner* — Kenneth B Wells
(74) *Attorney, Agent, or Firm* — Shumaker & Sieffert, P.A.

(57) ABSTRACT

A driver circuit may be configured to control a power switch. The driver circuit may comprise an output pin configured to deliver signals to a gate of the power switch to control an ON/OFF state of the power switch, and a comparator configured to compare a gate-to-source voltage of the power switch to a first threshold when the power switch is ON and to compare the gate-to-source voltage of the power switch to a second threshold when the power switch is OFF.

19 Claims, 9 Drawing Sheets

GATE-TO-SOURCE MONITORING OF POWER SWITCHES DURING RUNTIME

TECHNICAL FIELD

This disclosure relates to power switches, and more specifically, techniques and circuits for monitoring the operation of power switch circuits.

BACKGROUND

Field Effect Transistors (FETs) are often used as power switches to control the delivery of power to a load. Examples of FETs may include, but are not limited to, junction field-effect transistor (JFET), metal-oxide-semiconductor FET (MOSFET), dual-gate MOSFET, any other type of FET, or any combination of the same. Examples of MOSFETS may include, but are not limited to, PMOS, NMOS, DMOS, or any other type of MOSFET, or any combination of the same. MOSFETs may be formed in silicon, gallium nitride, silicon carbide, or other materials.

Power switches are typically controlled by a driver circuit via a modulation control signal, such as pulse width modulation (PWM), pulse frequency modulation (PFM), pulse duration modulation, pulse density modulation, or another type of modulation control signal. Modulation control signals can be applied to the gate of a power switch so as to control on/off switching of the power switch, and thereby control the average amount of power delivered through the power switch to a load. The on/off switching of the power switch effectively chops its power delivery up into discrete parts. The average value of voltage and/or current fed to a load can be controlled by turning the switch ON and OFF at a fast rate. The longer the switch is on compared to the off periods, the higher the total power supplied to the load.

In many applications, two different power switches are configured in a high-side and low-side configuration, and the ON-OFF switching of the two power switches is synchronized in order to deliver the desired power to a switch node positioned between the high-side and low-side switch. Moreover, in some systems, different sets of high-side and low-side switches may be used to control different phases of a multi-phase electrical motor.

It is often desirable to monitor operation of power switches in order to promote safety and identify potential fault conditions.

SUMMARY

In general, this disclosure describes circuits and techniques that are applied by a driver circuit or a system in controlling a power switch and to monitor the power switch during operation. The circuits and techniques can facilitate gate-to-source monitoring of a power switch by using a single comparator for the power switch in order to monitor ON-OFF transitions and to separately monitor OFF-ON transitions of the power switch during operation of the power switch. The comparator can be configured to compare a gate-to-source voltage of the power switch to a first threshold when the power switch is ON and to compare the gate-to-source voltage of the power switch to a second threshold when the power switch is OFF. The comparator may be configurable with either the first threshold or the second threshold based on one or more control signals from a control unit. Moreover, in some examples, the comparator can be configured to have a first polarity when the power switch is ON and configured to have a second polarity when the power switch is OFF, wherein the first polarity is different than the second polarity. The power switch may comprise a high-side power switch or a low-side power switch of a half bridge circuit. In some examples for a half-bridge circuit, a first comparator may be used with the high-side power switch and second comparator may be used with the low-side power switch in order to perform the gate-to-source monitoring for both the high-side power switch and the low-side power switch according to this disclosure.

In one example, this disclosure describes a driver circuit configured to control a power switch, the driver circuit comprising: an output pin configured to deliver signals to a gate of the power switch to control an ON/OFF state of the power switch; and a comparator configured to compare a gate-to-source voltage of the power switch to a first threshold when the power switch is ON and to compare the gate-to-source voltage of the power switch to a second threshold when the power switch is OFF. The comparator may be configurable with either the first threshold or the second threshold based on one or more control signals from a control unit. In some examples, the comparator is configured to have a first polarity when the power switch is ON and configured to have a second polarity when the power switch is OFF, wherein the first polarity is different than the second polarity.

In another example, this disclosure describes a system comprising: a control unit; and a driver circuit configured to receive control signals from the control unit and to control a half-bridge based on the control signals, wherein the half-bridge includes a high-side power switch and a low-side power switch. In this example, the driver circuit may comprise a first output pin configured to deliver high-side signals to a gate of the high-side power switch to control an ON/OFF state of the high-side power switch and a second output pin configured to deliver low-side signals to a gate of the low-side power switch to control an ON/OFF state of the low-side power switch. In addition, the driver circuit may comprise a first comparator configured to compare a gate-to-source voltage of the high-side power switch to a first threshold when the high-side power switch is ON and to compare the gate-to-source voltage of the high-side power switch to a second threshold when the high-side power switch is OFF, and a second comparator configured to compare a gate-to-source voltage of the low-side power switch to the first threshold when the low-side power switch is ON and to compare the gate-to-source voltage of the low-side power switch to the second threshold when the low-side power switch is OFF.

In another example, this disclosure describes a method of controlling a power switch, whereby the method comprises delivering signals to a gate of the power switch to control an ON/OFF state of the power switch; receiving a first threshold to configure a comparator; comparing a gate-to-source voltage of the power switch to the first threshold when the power switch is ON; receiving a second threshold to configure the comparator, wherein the second threshold is different than the first threshold; and comparing the gate-to-source voltage of the power switch to the second threshold when the power switch is OFF.

Details of these and other examples are set forth in the accompanying drawings and the description below. Other features, objects, and advantages will be apparent from the description and drawings, and from the claims.

DETAILED DESCRIPTION

This disclosure describes circuits and techniques that are applied by a driver circuit or a larger system in controlling a power switch and to monitor the power switch during normal operation of the power switch. The circuits and techniques can facilitate gate-to-source monitoring of a power switch by using a single comparator for the power switch in order to monitor ON-OFF transitions and to separately monitor OFF-ON transitions of the power switch during operation of the power switch, e.g., during each switching cycle of the power switch. The comparator can be configured to compare a gate-to-source voltage of the power switch to a first threshold when the power switch is ON and to compare the gate-to-source voltage of the power switch to a second threshold when the power switch is OFF.

The comparator may be configurable with either the first threshold or the second threshold based on one or more control signals from a control unit, such as a microcontroller or microprocessor. Moreover, in some examples, the comparator can be configured to have a first polarity when the power switch is ON and configured to have a second polarity when the power switch is OFF, wherein the first polarity is different than the second polarity. By controlling the polarity of the comparator, logic signals from the comparator can be simplified such that the same logic signal can be generated for identifying either latent faults during ON-OFF transitions or latent faults during OFF-ON transitions.

The power switch may comprise a high-side power switch or a low-side power switch of a half bridge. In some examples for a half-bridge, a first comparator may be used with the high-side power switch and second comparator may be used with the low-side power switch in order to perform the gate-to-source monitoring for both the high-side power switch and the low-side power switch according to this disclosure. The half-bridge may comprise one of several half-bridge circuits used for controlling an electric motor. Each phase of the electric motor may be controlled by a half-bridge, each of the half-bridges may comprise high-side and low-side power switches, and each of the power switches may be controlled by a driver that includes a comparator for monitoring the respective power switch according to this disclosure.

Figure 1:
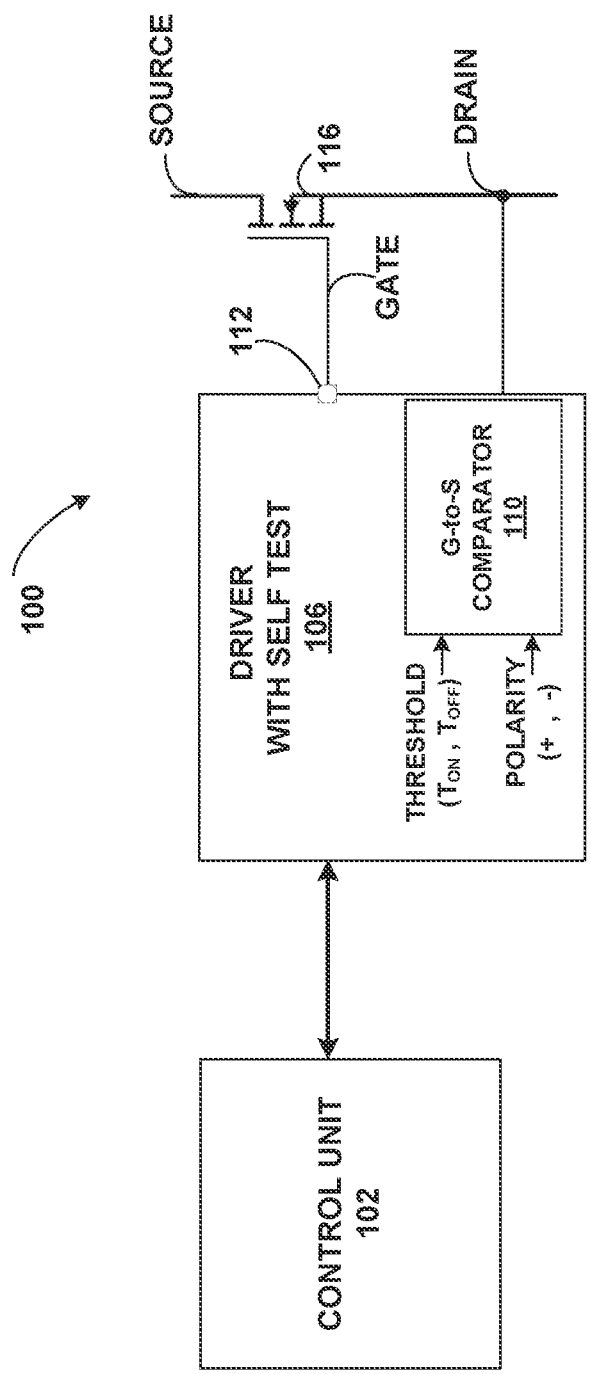
FIG. 1 is a block diagram of a system comprising a driver circuit that controls a power switch and monitors operation of the power switch according to this disclosure.

FIG. 1 is a block diagram a system 100 comprising a driver circuit 106 that controls a power switch 116 and monitors operation of power switch 116 using a gate-to-source comparator 110 according to this disclosure. The source, the gate, and the drain of power switch 116 are labeled in FIG. 1.

Driver circuit 106 is configured to control power switch 116. Driver circuit 106 comprises an output pin 112 configured to deliver signals to a gate of power switch 116 in order to control an ON/OFF state of the power switch 116. For example, driver circuit 106 may deliver pulse modulation signals to the gate of power switch 116 in order to control power switch 116 ON and OFF. The pulse modulation signals may comprise pulse width modulation (PWM) signals, pulse frequency modulation (PFM) signals, pulse duration modulation signals, pulse density modulation signals, or other types of modulation signals for controlling power switches. Control unit 102 may send control signals to driver circuit 106 that define the modulation signals.

As shown in FIG. 1, driver circuit 106 includes a comparator 110 that is configured to compare a gate-to-source voltage of power switch 116 to a first threshold (Ton) when power switch 116 is ON and to compare the gate-to-source voltage of power switch 116 to a second threshold (Toff) when the power switch 116 is OFF. By using the same comparator 110 to monitor both the first and second thresholds at different times of operation, the number of comparators needed for the monitoring can be reduced relative to one or more conventional techniques. In this case, comparator 110 is configurable to apply a first threshold (Ton) when the power switch 116 is ON and to apply a second threshold (Toff) when the power switch 116 is OFF. For example, comparator may be configurable with either the first threshold or the second threshold based on one or more signals from control unit 102.

Comparator 110 may be configured to output a first logic signal in response to the gate-to-source voltage being greater than the first threshold when power switch 116 is ON and to output a second logic signal in response to the gate-to-source voltage being less than the second threshold when power switch 116 is OFF. In this case, the absence of a logic signal from comparator 110 during any switching cycle of power switch 116 may indicate a fault associated with comparator 110. Such a fault due to the absence of a logic signal from comparator 110 during a switching cycle, for example, may be used as a self-test on the operation of comparator 110 during operation of power switch 116, and may be used by control unit 102 to issue a maintenance alert for the system 100 when a fault is identified. For example, in response to receiving an indication of a fault from comparator 110, which may comprise the absence of an expected logic signal, control unit 102 may issue a maintenance alert for the system 100. In such cases, the signals from comparator 110 may be identified as being unreliable.

In some examples, the polarity of comparator 110 is also configurable, e.g., based on control signals from control unit 102. By configuring and re-configuring the polarity of comparator 110, the logic signals from comparator 110 can be made similar for identifying both the ON state and the OFF state of power switch 116. Comparator 110 may be configured to have a first polarity when power switch 116 is ON and configured to have a second polarity when power switch 116 is OFF, wherein the first polarity is different than the second polarity. As will be described in greater detail below, this can simplify logic signals from comparator 116.

Figure 2:
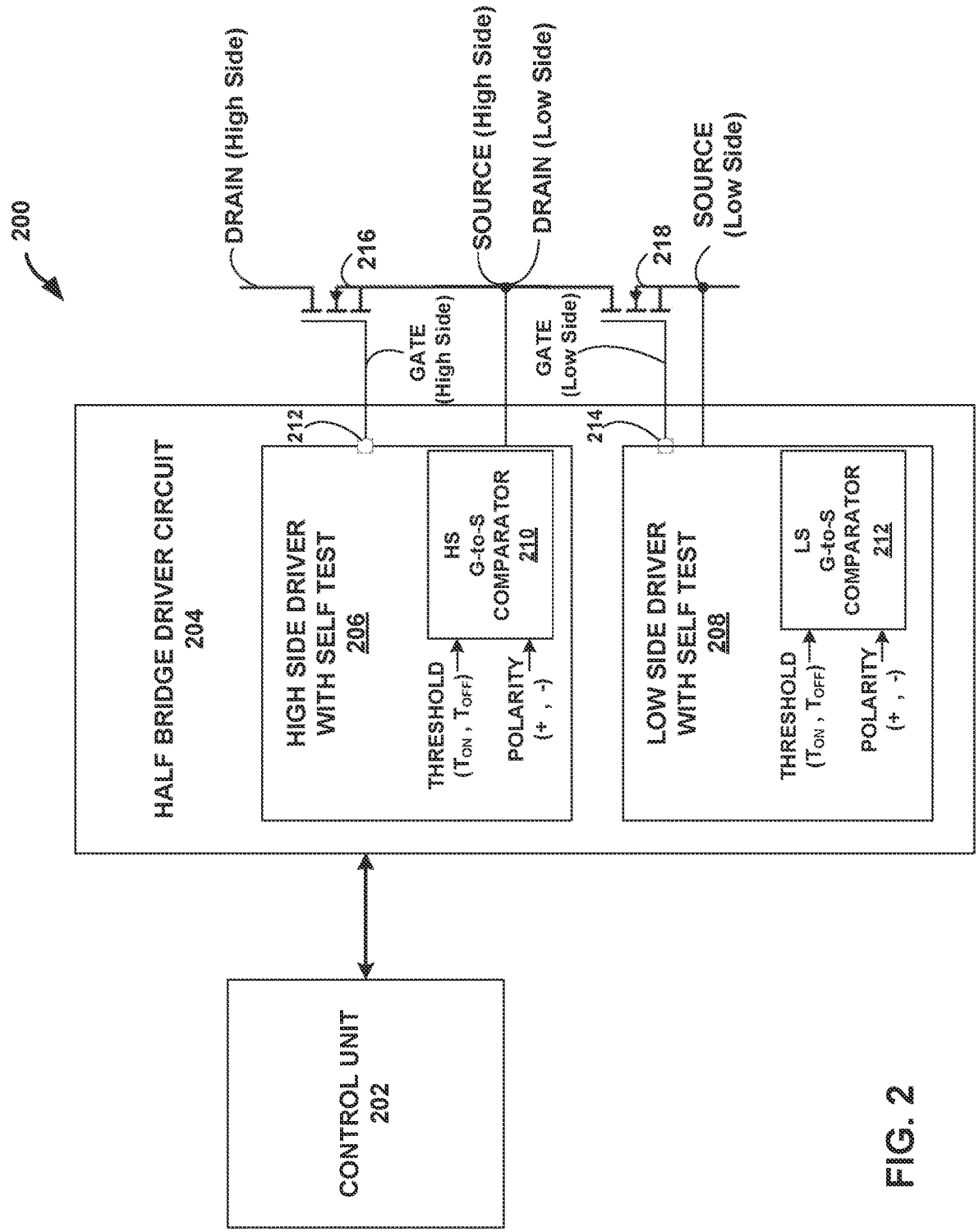
FIG. 2 is a block diagram of a system that includes a half-bridge driver circuit that controls a high-side power switch and a low-side power switch and monitors operation of the high-side and low-side power switches according to this disclosure.

FIG. 2 is a block diagram of a system that includes a half-bridge driver circuit 204 that controls a high-side power switch 216 and a low-side power switch 218 and monitors operation of high-side power switch 216 and low-side power switch 218 according to this disclosure. The source, the gate, and the drain of both high-side power switch 216 and low-side power switch 218 are labeled in FIG. 2.

Half-bridge driver circuit 204 includes a high-side driver 206 configured to control a high-side power switch 216 and a low-side driver 208 configured to control a low-side power switch 218. The half-bridge driver circuit comprises a first output pin 212 configured to deliver high-side signals to a gate of high-side power switch 216 to control an ON/OFF state of high-side power switch 216, and a second output pin 214 configured to deliver low-side signals to a gate of low-side power switch 218 to control an ON/OFF state of the low-side power switch 218. A first comparator 210 is configured to compare a gate-to-source voltage of high-side power switch 216 to a first threshold when high-side power switch 216 is ON and to compare the gate-to-source voltage of high-side power switch 216 to a second threshold when high-side power switch 216 is OFF. In addition, a second comparator 212 is configured to compare a gate-to-source voltage of low-side power switch 218 to the first threshold when low-side power switch 218 is ON and to compare the gate-to-source voltage of low-side power switch 218 to the second threshold when the low-side power switch 218 is OFF.

Each of comparators 210 and 212 operate in a manner that is similar to operation of comparator 110 shown in FIG. 1. Thus, each comparator 210, 212 is configurable to apply a first threshold (Ton) when the power switch 116 is ON and to apply a second threshold (Toff) when the power switch 116 is OFF. For example, each comparator 210, 212 may be configurable with either the first threshold or the second threshold based on one or more signals from control unit 202.

Each comparator 210, 212 may be configured to output a first logic signal in response to the respective gate-to-source voltage being greater than the first threshold when power switch 216 or 218 is ON and to output a second logic signal in response to the respective gate-to-source voltage being less than the second threshold when power switch 216 or 218 is OFF. In each case, the absence of a logic signal from comparator 210 or 212 during a switching cycle of power switch 216 or 218 may indicate a fault associated with respective comparator 210 or 212. Such a fault due to the absence of a logic signal from comparator 210 or 212 during a switching cycle, for example, may be used by control unit 202 to issue a maintenance alert for the system 200. For example, in response to receiving an indication of a fault from a comparator 210 or 212, which may comprise the absence of an expected logic signal, control unit 202 may issue a maintenance alert for the system 200. In such cases, the signals from one or both of comparators 210, 212 may be identified as being unreliable.

As with the example shown in FIG. 1, in FIG. 2, the polarity of comparators 210, 212 is also configurable, e.g., based on control signals from control unit 202. By configuring and re-configuring the polarity of comparators 210, 212, the logic signals from comparators 210, 212 can be made similar for identifying both the ON state and the OFF state of power switches 216 and 218. Comparators 210, 212 may be configured to have a first polarity when the respective power switch 216 or 218 is ON and configured to have a second polarity when the respective power switch 216 or 218 is OFF, wherein the first polarity is different than the second polarity. Thus, each of first comparator 210 and second comparator 212 are configurable with either the first threshold or the second threshold based on one or more control signals from control unit 202. This polarity toggling of comparators 210 or 212 can simplify logic signals in system 200.

Comparators 210 and 212 operate in a similar and complementary fashion on the high-side and the low-side. First comparator 210 is configured to output a first logic signal in response to the gate-to-source voltage of high-side power switch 216 being greater than the first threshold when high-side power switch 216 is ON and to output a second logic signal in response to the gate-to-source voltage of high-side power switch 216 being less than the second threshold when high-side power switch 216 is OFF. Similarly, second comparator 212 is configured to output a third logic signal in response to the gate-to-source voltage of low-side power switch 218 being greater than the first threshold when low-side power switch 218 is ON and to output a fourth logic signal in response to the gate-to-source voltage of low-side power switch 218 being less than the second threshold when low-side power switch 218 is OFF. Absence of a first or second logic signal from first comparator 210 during a switching cycle may indicate a fault associated with first comparator 210 and absence of a third or fourth logic signal from second comparator 212 during the switching cycle may indicate a fault associated with second comparator 212.

Half-bridge driver circuit 204 is configured to turn high-side power switch 216 and the low-side power switch ON and OFF in a complementary fashion. Accordingly, comparators 210 and 212 also operate in a complementary fashion. Thus, with a half-bridge configuration, first comparator 210 is configured to have a first polarity when high-side power switch 216 is ON (e.g., when low-side power switch 218 is OFF) and configured to have a second polarity when high-side power switch 216 is OFF (e.g., when high-side power switch is ON), wherein the first polarity is different than the second polarity. Second comparator 212 is configured to have the first polarity when low-side power switch 218 is ON (e.g., when high side power 216 switch is OFF) and configured to have the second polarity when the low-side power switch 218 is OFF (e.g., when high-side power switch 216 is ON).

System 200 may comprise a circuit for controlling one phase of a multi-phase electric motor, such as a motor used within a vehicle. In order to control the motor, a circuit may comprise a plurality of driver circuits, e.g., similar to half-bridge driver circuit 204, configured to control a plurality of half-bridges. The plurality of half-bridges is configured to control the multi-phase electric motor.

Figure 3:
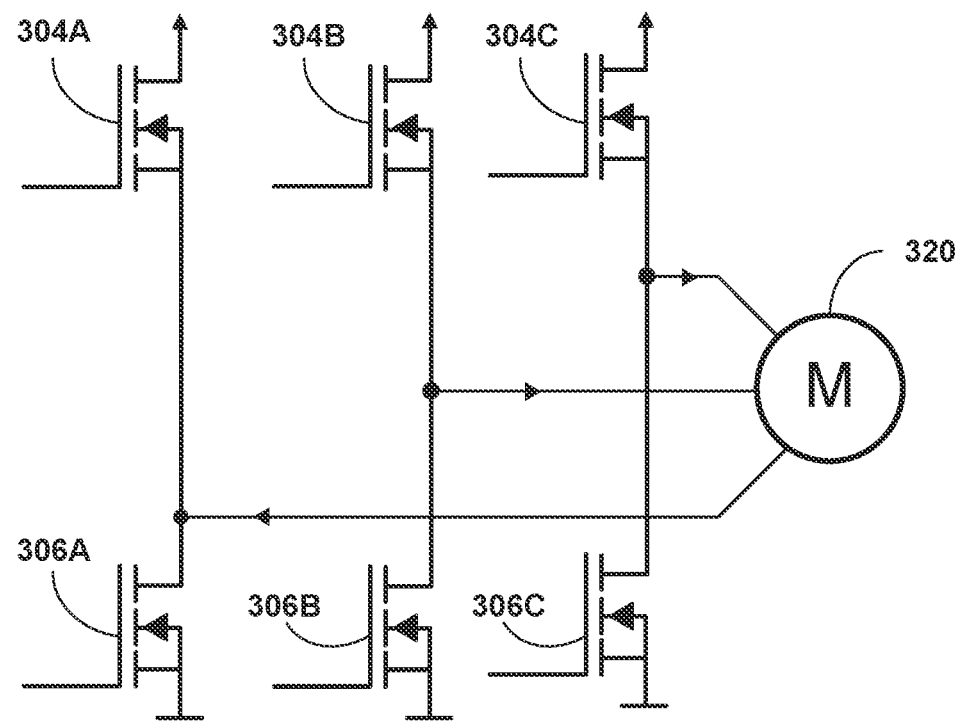
FIG. 3 is a circuit diagram showing three half-bridges arranged to control operation of an electric motor.

FIG. 3 is a circuit diagram showing three half-bridges arranged to control operation of an electric motor 320. Power switches 304A and 306A define a first half-bridge, power switches 304B and 306B define a second half-bridge, and power switches 304C and 306C define a third half-bridge. Each half-bridge may be controlled by a half-bridge driver circuit similar to half-bridge driver circuit 204 of FIG. 2. Separate drivers (similar to driver 106 of FIG. 1) could also be used for each power switch shown in FIG. 3.

Figure 4A:
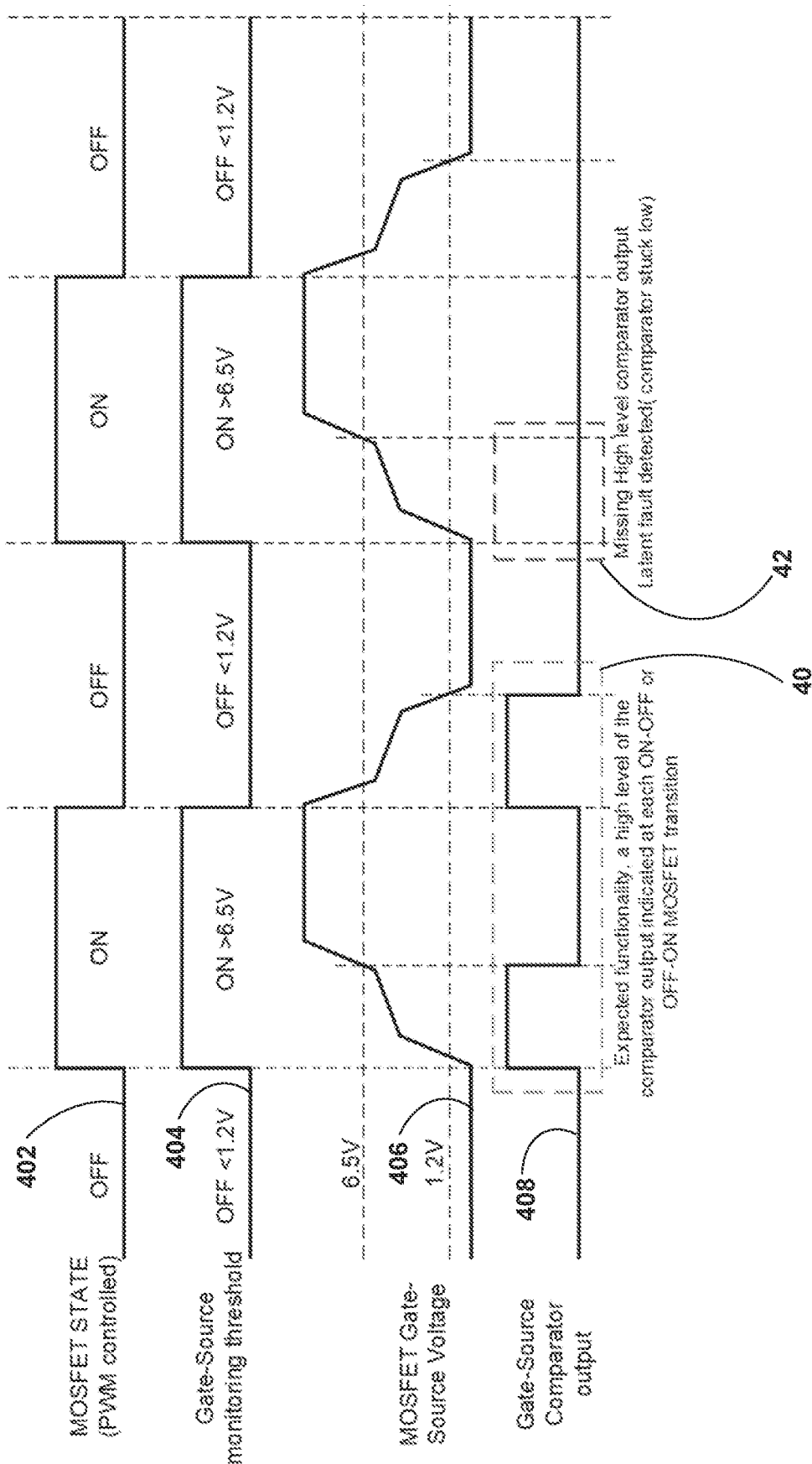
FIGS. 4A-4D are timing diagrams illustrating one or more aspects of this disclosure.
Figure 4B:
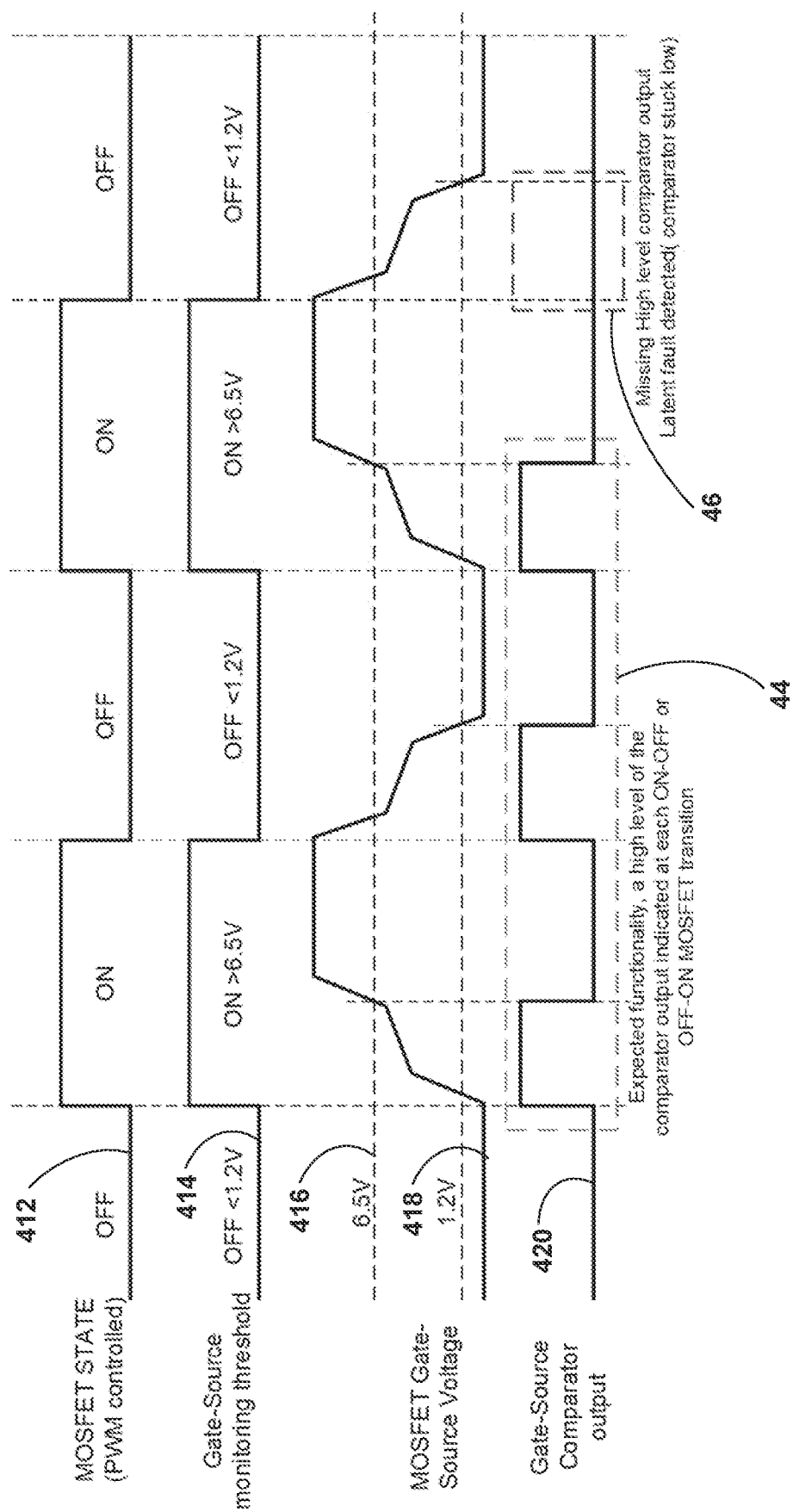

FIGS. 4A-4D are timing diagrams illustrating one or more aspects of this disclosure. FIGS. 4A and 4B show some example faults that may be defined by the absence of an expected logic signal from a comparator according to this disclosure.

As shown in FIG. 4A, a driver 106 may deliver signals to a power switch 116 to control the ON/OFF state of power switch 116 as defined by graph line 402. Graph line 404 defines gate-to-source monitoring thresholds whereby less than 1.2 Volts is an OFF threshold and greater than 6.5 Volts is an ON threshold. The gate-to-source voltage over power switch 116 is shown in graph line 406, and one example output of a gate-to-source comparator 110 of driver 106 is shown in graph line 408. As can be seen in FIG. 4A, expected output 40 are periodic logic signals indicating an ON state followed by an OFF state. However, output 42 defines the absence of an expected logic signal for a turn ON, which can identify a latent fault indicating that the output of comparator 110 is not necessarily reliable. In such a situation, control unit 102 may respond with appropriate action, such as by issuing a maintenance alert, or possibly disabling operation of the power switch until maintenance can be performed.

FIG. 4B is another timing diagram showing an example fault that can be identified from a missing logic pulse from a comparator during an OFF transition. In FIG. 4B, a driver 106 may deliver signals to a power switch 116 to control the ON/OFF state of power switch as defined by graph line 412. Graph line 414 defines gate-to-source monitoring thresholds whereby less than 1.2 Volts is an OFF threshold and greater than 6.5 Volts is an ON threshold. In the example shown in FIG. 4B, the gate-to-source voltage over power switch 106 is shown in graph line 416, and one example output of gate-to-source comparator 110 is shown in graph line 418. As can be seen in FIG. 4B, expected output 44 are periodic logic signals indicating an ON state followed by an OFF state. However, output 46 defines the absence of an expected logic signal for a turn OFF, which can identify a latent fault indicating that the output of comparator 110 is not necessarily reliable. In such a situation, control unit 102 may respond with appropriate action, such as by issuing a maintenance alert, or possibly disabling operation of the power switch until maintenance can be performed.

Figure 4C:
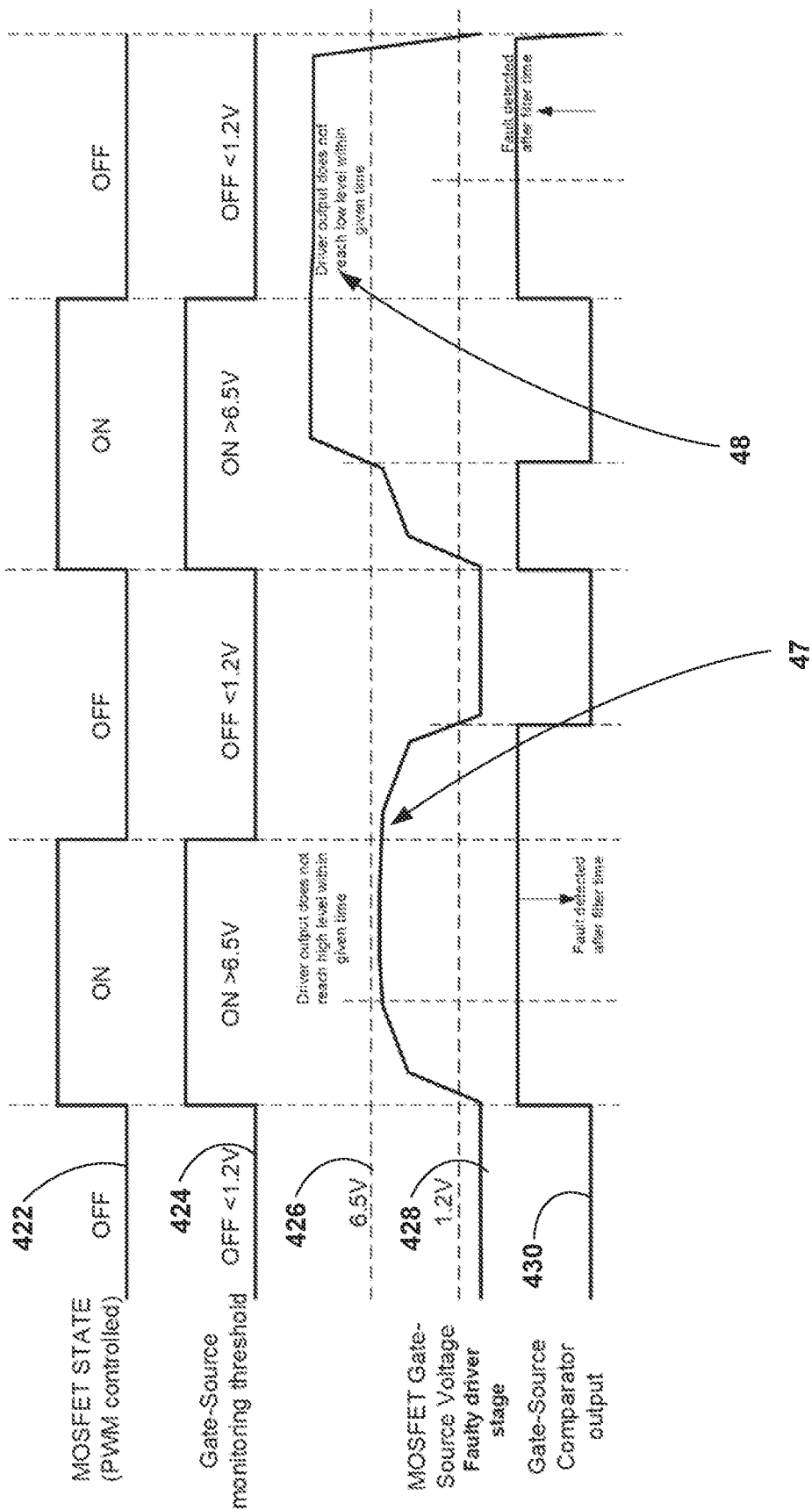

FIG. 4C illustrates faults that can be attributed to a faulty driver circuit (as opposed to a faulty comparator). In FIG. 4C, a driver 106 may deliver signals to a power switch 116 to control the ON/OFF state of power switch as defined by graph line 422. Graph line 424 defines gate-to-source monitoring thresholds whereby less than 1.2 Volts is an OFF threshold and greater than 6.5 Volts is an ON threshold. The gate-to-source voltage over the power switch is shown in graph line 426, and one example output of gate-to-source comparator 110 is shown in graph line 428. As can be seen in FIG. 4C at location 47 of graph line 428, driver output does not reach a high level (i.e., does not exceed 6.5 volts) within a defined amount of time for a turn ON transition, which may indicate problems with the driver. Alternatively, as can be seen in FIG. 4C at location 48 of graph line 428, driver output does not reach a low level (i.e., does not go below 1.5 volts) within a defined amount of time for turn OFF transition, which may indicate problems with the driver. The faults shown in FIG. 4C may cause a controller to disable the driver until maintenance can be performed, otherwise, the power switch may be destroyed by improper drive signals.

Figure 4D:
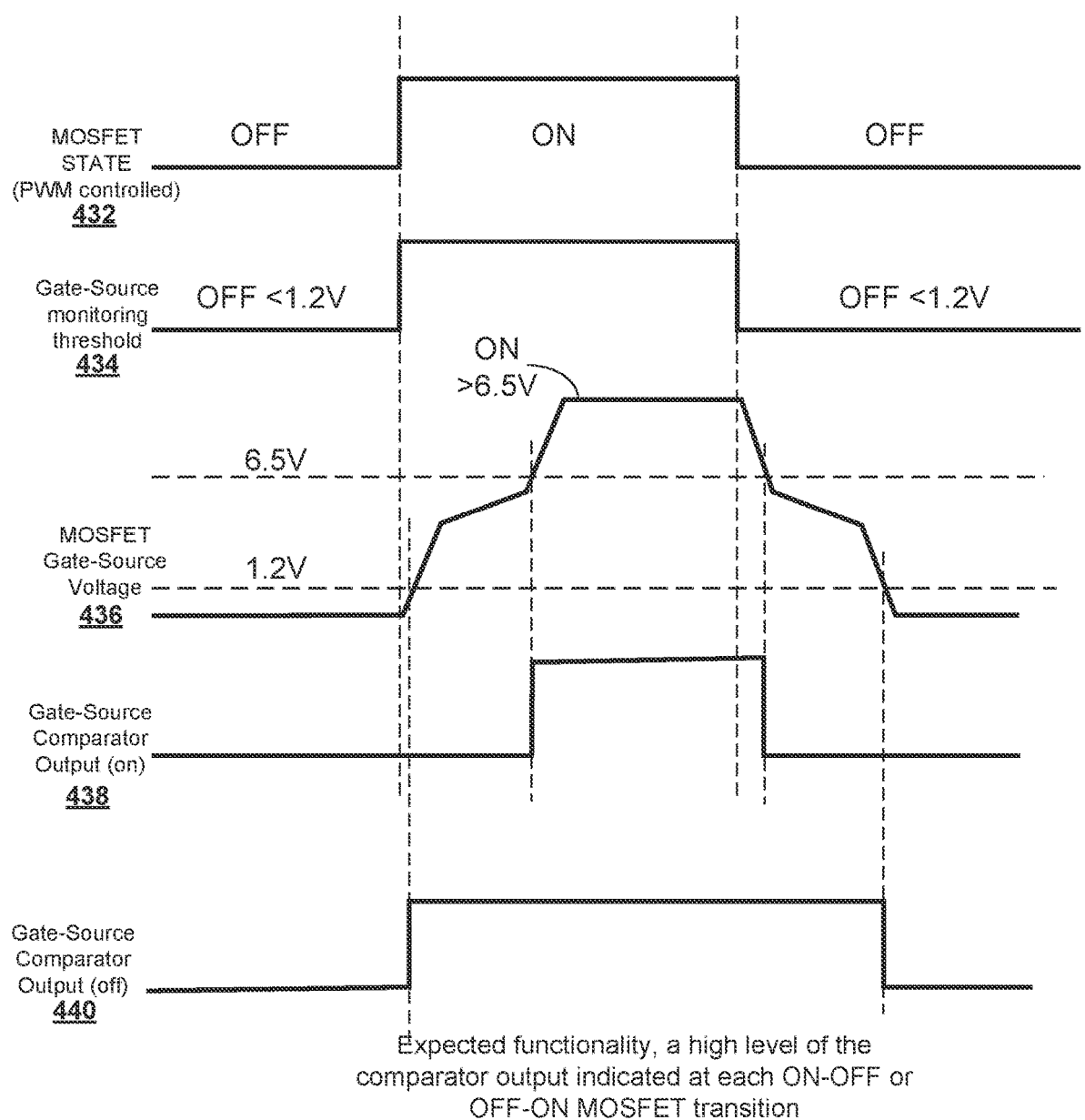

In contrast to FIGS. 4A-4C, FIG. 4D shows operation of a different system that does not make use of comparators that are configured as described herein. Rather, the system operation shown in FIG. 4D may utilize separate comparators to monitor an upper "turn on" threshold of e.g., 6.5 Volts and to monitor a lower "turn off" threshold of e.g., 1.2 Volts. In this case, a driver circuit may deliver signals to a power switch to control the ON/OFF state of power switch as defined by graph line 432. Graph line 434 defines gate-to-source monitoring thresholds used by two different comparators whereby less than 1.2 Volts is an OFF threshold checked by a comparator and greater than 6.5 Volts is an ON threshold checked by a different comparator. The gate-to-source voltage over the power switch is shown in graph line 436. As can be seen in FIG. 4D, a first gate-to-source comparator signal 438 is defined by a first comparator to identify when the gate-to-source voltage is above 6.5 Volts and a second gate-to-source comparator signal 440 is defined by a second comparator to identify when the gate-to-source voltage is below 1.2 Volts and a second. Not only does the operation shown in FIG. 4D require an additional comparator for each power switch relative to the techniques of this disclosure, but signal processing is more complicated relative to the periodic logic signals expected according to the examples shown in FIGS. 4A and 4B.

In the diagrams of 4A and 4B, two scenarios are depicted in which the power switch gate-source monitoring circuitry may be stuck and cannot be used anymore for proper detection power switch functionality. According to this disclosure, a single voltage comparator is used instead of two independent monitoring circuitries for the gate-source voltage of a power switch.

As shown in FIG. 4A, in an ON state (expected gate-source voltage above 6.5V), the gate-source comparator output stage is checked after the turn-on time. In this case, a low level may indicate that the power switch is correctly turned-on and gate-source voltage is higher than 6.5V. Moreover, in this case, a high level may indicate an under-voltage condition, in which case the power switch cannot be reliably turned ON, and an error is reported to the control unit to take the proper action.

As shown in FIG. 4B, in an OFF state (expected gate-source voltage below 1.2V), the voltage comparator output is checked after the turn-off time. In this case, a low level indicates that the power switch is correctly turned-off such that gate-source voltage is lower than 1.2V. A high level indicates over-voltage condition, the power switch cannot be reliably turned ON, and an error may be reported to the control unit to take the proper action In order to allow periodic self-checks of this monitoring feature using a single comparator, the turn-on and turn-off time windows are used. During these times the power switch gate voltage is ramping up (e.g., for turn-on) or down (e.g., for turn-off). By using a single comparator with inverted polarity:

In power switch-ON state, a failure is qualified by a gate-source voltage lower than the comparator threshold In power switch-OFF state, a failure is qualified by a gate-source voltage higher than the comparator threshold, Correct monitor functionality can be achieved with a comparator output that always indicates a high level (e.g., logic high) when the gate voltage properly ramps up or down. In this way, whenever a low-high transition is not present on the comparator output (which may be checked by digital logic located within driver 106 or within drivers 206 and 208) this lack of an expected logic pulse can be interpreted as a malfunction of the monitoring feature, latent fault detection can be triggered, and signaled from the driver to the control unit to indicate that the respective monitor feature is not reliable.

For a three-phase electric motor application like that shown in FIG. 3, e.g., with six power switches to be controlled, the circuit monitoring of this disclosure may result in a reduction from twelve gate-source monitoring comparators to only six, and a built-in periodic self-test of the monitoring feature without switching OFF the monitoring feature. The described solutions of this disclosure may also achieve additional advantages. For example, the techniques may use the actual comparator circuitry also for the periodic self-check, such that no additional switching of the reference voltages or comparator inputs are needed to force a functional check of the monitors. The described circuits may also achieve a much faster reaction time than conventional monitoring techniques, and the described circuits can be used as a safety mechanism ensuring that all faults are detected within the fault tolerant time interval. In case the detection is taking place during every switching cycle during operation of a power switch, and the self-test can only be used to detect multiple faults, where the fault tolerant time is much higher.

By toggling the polarity of the comparator (or comparators) when changing the thresholds of the comparator, the expected logic signals may comprise a pulse that identifies turn on and a similar pulse that identifies turn off. Thus, by toggling the polarity of the comparator (or comparators) when changing the threshold, the same type of logic pulse can be created when gate-to-source voltage exceeds Ton and when gate-to-source voltage falls below Toff. It is also possible to implement the techniques without changing polarity of the comparator (or comparators), but in this case, the control unit would need to be programmed to identify logic high as the expected logic pulse when comparing to the first threshold Ton and logic low as the expected logic pulse when comparing to the second threshold Toff. Toggling the polarity of the comparator (or comparators) when changing the threshold, thus, can simplify logic or programming that may otherwise needed in the control unit that controls the driver circuit(s).

Power switches described herein (e.g., power switches 116, 216, 218, 304A-304C, and 306A-306C) may each comprise a power transistor, such as a metal oxide semiconductor field effect transistor (MOSFET). The MOSFET may be formed in silicon, in which case the MOSFET may be called a silicon MOSFET. Alternatively, the MOSFET may be formed in another semiconductor material, such as silicon carbide (SiC) or gallium nitride (GaN), in which case the MOSFET may be called a SiC MOSFET or a GaN MOSFET. Indeed, the techniques of this disclosure may be especially useful for monitoring MOSFETS that are used for controlling a three-phase electric motor, such as those used in vehicles. The techniques of this disclosure may also work with other types of transistors, such as bipolar gate transistors (BGTs), in which case the gate-to-source monitoring would comprise monitoring of a gate to emitter voltage of the BGTs.

Figure 5:
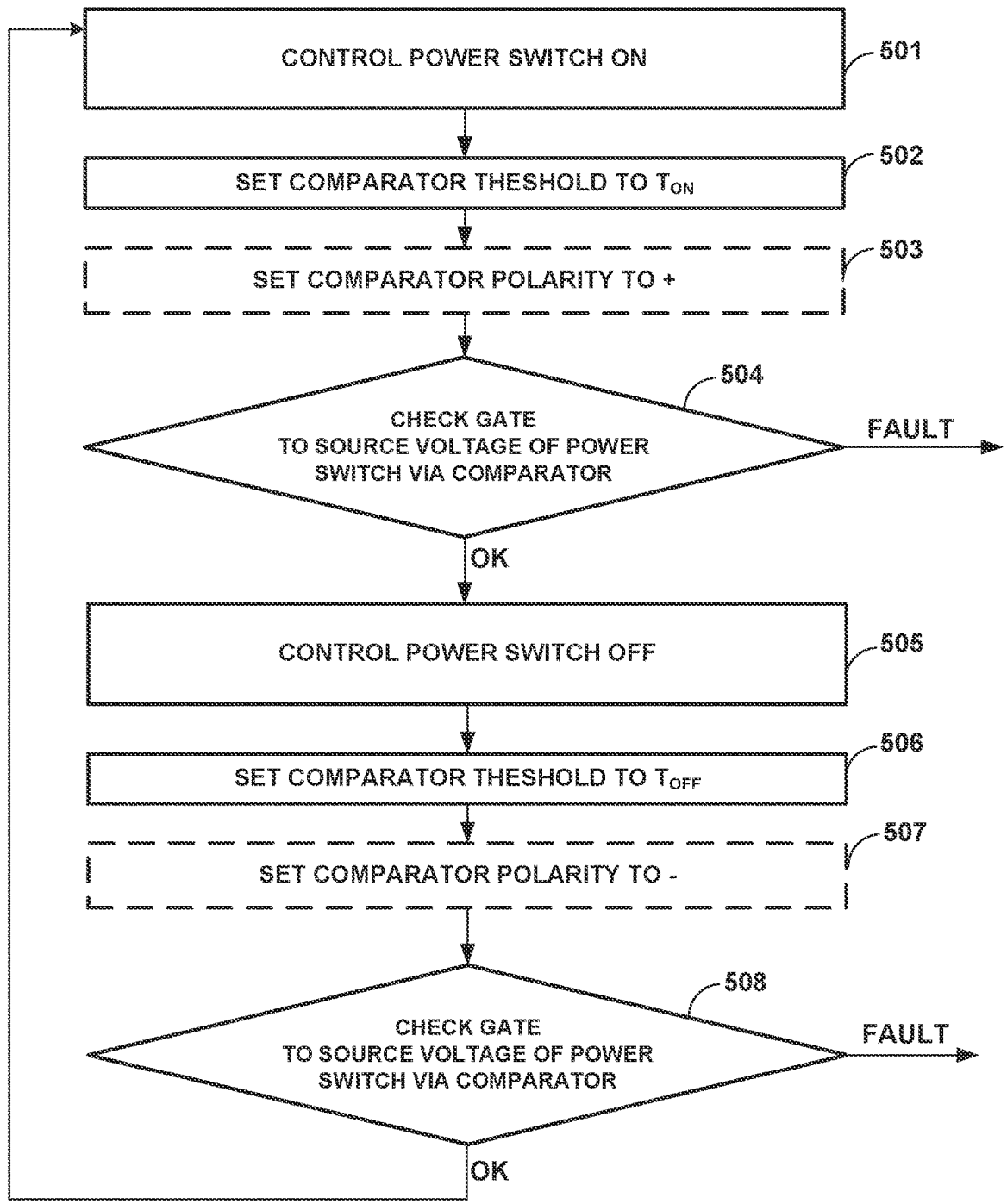
FIGS. 5 and 6 are flow diagrams according to this disclosure.
Figure 6:
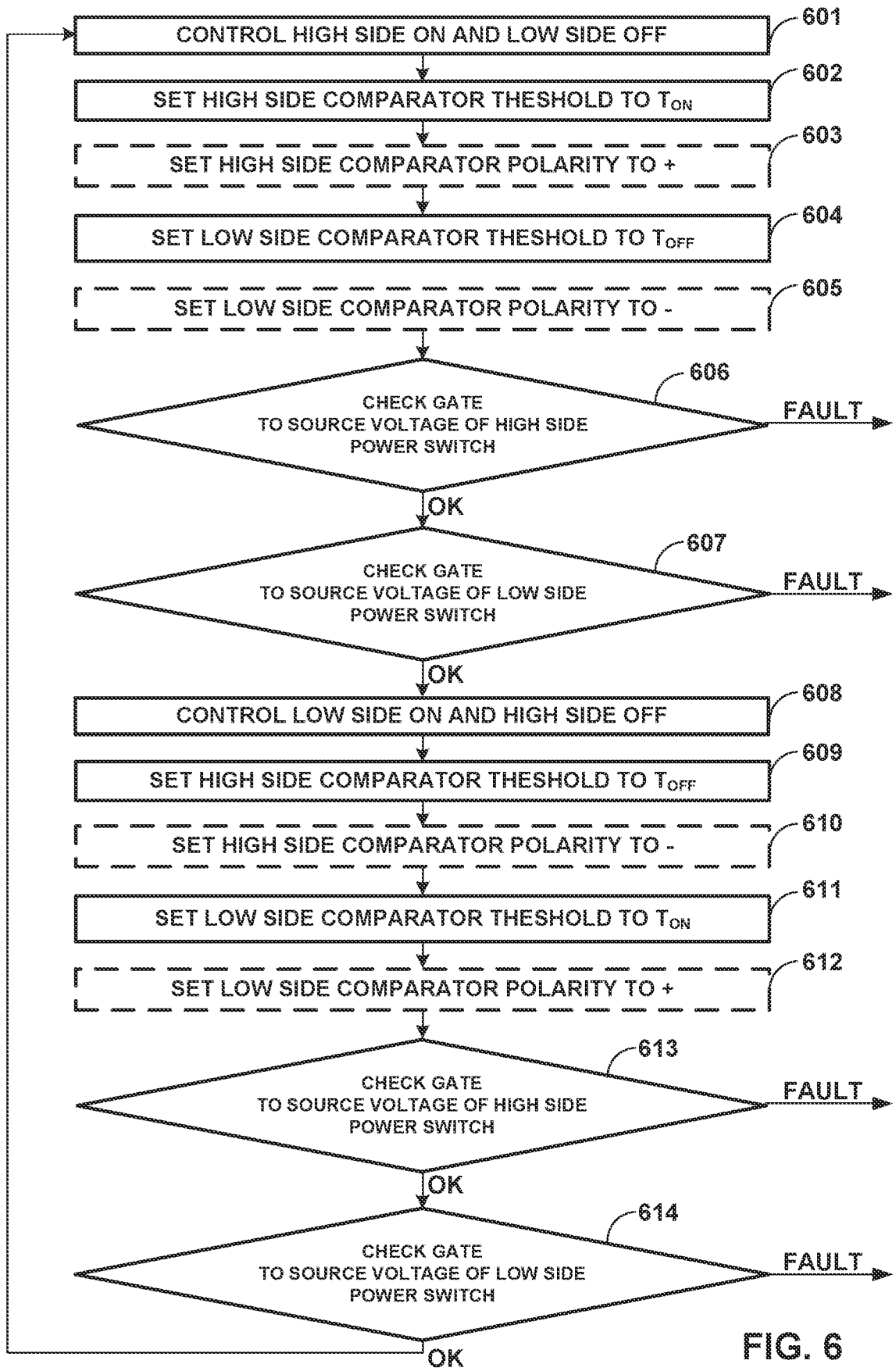

FIGS. 5 and 6 are flow diagrams according to this disclosure. FIG. 5 will be described from the perspective of driver circuit 106 of FIG. 1 although other circuits or devices may also perform the technique shown in FIG. 5. As shown in FIG. 5, driver circuit 106 controls a power switch 116 to ON (501), such as by delivering sufficient voltage to the gate of power switch 116. Based on signals from control unit 102, driver circuit 106 sets the threshold of comparator 110 to a first threshold "Ton" (502) and in some examples, driver also sets the polarity of comparator 110 to positive "+" (503). During the expected switch-ON cycle, driver 106 checks the gate-to-source voltage of the power switch via comparator 110 (504). In particular, comparator 110 compares the gate-to-source voltage of power switch 116 to the "Ton" threshold and outputs an expected logic signal when the gate-to-source voltage exceeds the "Ton" threshold. If the expected logic signal is present, then circuit operation is verified, and everything is OK (OK branch of 504). However, if the expected logic signal is absent, then circuit operation is unverified such that there could be a problem (FAULT branch of 504). In the case of a FAULT due to a missing logic signal, the control unit 102 may issue an alert for maintenance (FAULT branch of 504).

As further shown in FIG. 5, driver circuit 106 then controls a power switch 116 to OFF (505), such as by delivering lower voltage to the gate of power switch 116. Based on signals from control unit 102, driver circuit 106 sets the threshold of comparator 110 to a second threshold "Toff" (506) and in some examples, driver also sets the polarity of comparator 110 to negative "−" (507). During the expected switch-OFF cycle, driver 106 checks the gate-to-source voltage of the power switch via comparator 110 (508). In particular, comparator 110 compares the gate-to-source voltage of power switch 116 to the "Toff" threshold and outputs an expected logic signal when the gate-to-source voltage falls below the "Toff" threshold. If the expected logic signal is present, then circuit operation is verified, and everything is OK (OK branch of 508). However, if the expected logic signal is absent, then circuit operation is unverified such that there could be a problem (FAULT branch of 508). In the case of a FAULT due to a missing logic signal, the control unit 102 may issue an alert for maintenance.

FIG. 6 is a flow diagram that is similar to FIG. 5, but FIG. 6 shows complementary operation of two different driver circuits that control a high-side switch and a low-side switch. FIG. 6 will be described from the perspective of half-bridge driver circuit 204 of FIG. 2, although other circuits or devices may also perform the technique shown in FIG. 6. As shown in FIG. 2, half bridge-driver circuit 204 comprises a high-side driver circuit 206 for controlling high-side power switch 216 and a low-side driver circuit 208 for controlling low-side power switch 218. High-side driver circuit 206 and low-side driver circuit 208 may comprise separate circuits formed on separate semiconductor substrates, or in some examples, high-side driver circuit 206 and low-side driver circuit 208 may comprise a single integrated circuit.

As shown in FIG. 6, half-bridge driver circuit 204 controls high-side power switch 216 to ON and low side power switch to OFF (601), such as by high-side driver circuit 206 delivering sufficient voltage to the gate of high-side power switch 216 and low-side driver circuit 208 delivering low voltage to the gate of low-side power switch 218. Based on signals from control unit 202, high-side driver circuit 206 sets the threshold of comparator 210 to a first threshold "Ton" (602) and in some examples, high-side driver circuit 206 also sets the polarity of comparator 210 to positive "+" (603). Similarly and in a complementary fashion relative to operation of high-side driver circuit 206, based on the signals from control unit 202, low-side driver circuit 208 sets the threshold of comparator 212 to a second threshold "Toff" (604) and in some examples, low-side driver circuit 206 also sets the polarity of comparator 212 to negative "−" (605).

During the expected switch-ON cycle of high-side power switch 216, high-side driver 206 checks the gate-to-source voltage of the power switch via comparator 210 (606). In particular, comparator 210 compares the gate-to-source voltage of high-side power switch 216 to the "Ton" threshold and outputs an expected logic signal when the gate-to-source voltage exceeds the "Ton" threshold. If the expected logic signal is present, then circuit operation is verified, and everything is OK (OK branch of 606). However, if the expected logic signal is absent, then circuit operation is unverified such that there could be a problem (FAULT branch of 606). In the case of a FAULT due to a missing logic signal, the control unit 202 may issue an alert for maintenance (FAULT branch of 606).

The expected switch-ON cycle of high-side power switch 216 corresponds to an expected switch-OFF cycle of low-side power switch 218. Accordingly, low-side driver 208 checks the gate-to-source voltage of low-side power switch via comparator 212 (607). In particular, comparator 212 compares the gate-to-source voltage of low-side power switch 218 to the "Toff" threshold and outputs an expected logic signal when the gate-to-source voltage falls below the "Toff" threshold. If the expected logic signal is present, then circuit operation is verified, and everything is OK (OK branch of 607). However, if the expected logic signal is absent, then circuit operation is unverified such that there could be a problem (FAULT branch of 607). In the case of a FAULT due to a missing logic signal, the control unit 202 may issue an alert for maintenance (FAULT branch of 607).

As further shown in FIG. 5, half-bridge driver circuit 204 then controls high-side power switch 216 to OFF and low side power switch to ON (608), such as by high-side driver circuit 206 delivering low voltage to the gate of high-side power switch 216 and low-side driver circuit 208 delivering sufficient voltage to the gate of low-side power switch 218.

Based on signals from control unit 202, high-side driver circuit 206 sets the threshold of comparator 210 to the second threshold "Toff" (609) and in some examples, high-side driver circuit 206 also sets the polarity of comparator 210 to negative "−" (610). Similarly and in a complementary fashion relative to operation of high-side driver circuit 206, based on the signals from control unit 202, low-side driver circuit 208 sets the threshold of comparator 212 to the first threshold "Ton" (611) and in some examples, low-side driver circuit 206 also sets the polarity of comparator 212 to positive "−" (612).

During the expected switch-OFF cycle of high-side power switch 216, high-side driver 206 checks the gate-to-source voltage of the power switch via comparator 210 (613). In particular, comparator 210 compares the gate-to-source voltage of high-side power switch 216 to the "Toff" threshold and outputs an expected logic signal when the gate-to-source voltage falls below the "Toff" threshold. If the expected logic signal is present, then circuit operation is verified, and everything is OK (OK branch of 613). However, if the expected logic signal is absent, then circuit operation is unverified such that there could be a problem (FAULT branch of 613). In the case of a FAULT due to a missing logic signal, the control unit 202 may issue an alert for maintenance (FAULT branch of 613).

The expected switch-OFF cycle of high-side power switch 216 corresponds to an expected switch-ON cycle of low-side power switch 218. Accordingly, low-side driver 208 checks the gate-to-source voltage of low-side power switch via comparator 212 (614). In particular, comparator 212 compares the gate-to-source voltage of low-side power switch 218 to the "Ton" threshold and outputs an expected logic signal when the gate-to-source voltage exceeds the "Ton" threshold. If the expected logic signal is present, then circuit operation is verified, and everything is OK (OK branch of 614). However, if the expected logic signal is absent, then circuit operation is unverified such that there could be a problem (FAULT branch of 614). In the case of a FAULT due to a missing logic signal, the control unit 202 may issue an alert for maintenance (FAULT branch of 614).

The following clauses may illustrate one or more aspects of the disclosure.

Clause 1—A driver circuit configured to control a power switch, the driver circuit comprising: an output pin configured to deliver signals to a gate of the power switch to control an ON/OFF state of the power switch; and a comparator configured to compare a gate-to-source voltage of the power switch to a first threshold when the power switch is ON and to compare the gate-to-source voltage of the power switch to a second threshold when the power switch is OFF.

Clause 2—The driver circuit of clause 1, wherein the comparator is configurable with either the first threshold or the second threshold based on one or more control signals from a control unit.

Clause 3—The driver circuit of clause 1 or 2, wherein the comparator is configured to output a first logic signal in response to the gate-to-source voltage being greater than the first threshold when the power switch is ON and to output a second logic signal in response to the gate-to-source voltage being less than the second threshold when the power switch is OFF.

Clause 4—The driver circuit any of clauses 1-3, wherein the absence of a logic signal from the comparator during a switching cycle of the power switch indicates a fault associated with the comparator.

Clause 5—The driver circuit any of clauses 1-4, wherein the comparator is configured to have a first polarity when the power switch is ON and configured to have a second polarity when the power switch is OFF, wherein the first polarity is different than the second polarity.

Clause 6—A driver circuit configured to control a high-side power switch and a low-side power switch arranged in a half-bridge, the driver circuit comprising: a first output pin configured to deliver high-side signals to a gate of the high-side power switch to control an ON/OFF state of the high-side power switch; a second output pin configured to deliver low-side signals to a gate of the low-side power switch to control an ON/OFF state of the low-side power switch; a first comparator configured to compare a gate-to-source voltage of the high-side power switch to a first threshold when the high-side power switch is ON and to compare the gate-to-source voltage of the high-side power switch to a second threshold when the high-side power switch is OFF; and a second comparator configured to compare a gate-to-source voltage of the low-side power switch to the first threshold when the low-side power switch is ON and to compare the gate-to-source voltage of the low-side power switch to the second threshold when the low-side power switch is OFF.

Clause 7—The driver circuit of clause 6, wherein the first and second comparators are each configurable with either the first threshold or the second threshold based on one or more control signals from a control unit.

Clause 8—The driver circuit of claim 6 or 7, wherein the first comparator is configured to output a first logic signal in response to the gate-to-source voltage of the high-side power switch being greater than the first threshold when the high-side power switch is ON and to output a second logic signal in response to the gate-to-source voltage of the high-side power switch being less than the second threshold when the high-side power switch is OFF, and wherein the second comparator is configured to output a third logic signal in response to the gate-to-source voltage of the low-side power switch being greater than the first threshold when the low-side power switch is ON and to output a fourth logic signal in response to the gate-to-source voltage of the low-side power switch being less than the second threshold when the low-side power switch is OFF.

Clause 9—The driver circuit any of clauses 6-8, wherein an absence of a first or second logic signal from the first comparator during a switching cycle indicates a fault associated with the first comparator and wherein an absence of a third or fourth logic signal from the second comparator during the switching cycle indicates a fault associated with the second comparator.

Clause 10—The driver circuit any of clauses 6-9, wherein the driver is configured to turn the high-side power switch and the low-side power switch ON and OFF in a complementary fashion, wherein the first comparator is configured to have a first polarity when the high-side power switch is ON and configured to have a second polarity when the high-side power switch is OFF, wherein the first polarity is different than the second polarity, and wherein the second comparator is configured to have the first polarity when the low-side power switch is ON and configured to have the second polarity when the low-side power switch is OFF.

Clause 11—The driver circuit of any of clauses 6-10, further comprising a plurality of driver circuits configured to control a plurality of half-bridges.

Clause 12—The driver circuit of clause 11, wherein the plurality of half-bridges is configured to control a multi-phase electric motor.

Clause 13—A system comprising: a control unit; and a driver circuit configured to receive control signals from the control unit and to control a half-bridge based on the control signals, wherein the half-bridge includes a high-side power switch and a low-side power switch, the driver circuit comprising: a first output pin configured to deliver high-side signals to a gate of the high-side power switch to control an ON/OFF state of the high-side power switch; a second output pin configured to deliver low-side signals to a gate of the low-side power switch to control an ON/OFF state of the low-side power switch; a first comparator configured to compare a gate-to-source voltage of the high-side power switch to a first threshold when the high-side power switch is ON and to compare the gate-to-source voltage of the high-side power switch to a second threshold when the high-side power switch is OFF; and a second comparator configured to compare a gate-to-source voltage of the low-side power switch to the first threshold when the low-side power switch is ON and to compare the gate-to-source voltage of the low-side power switch to the second threshold when the low-side power switch is OFF.

Clause 14—The system of clause 13, the system further comprising the high-side power switch and the low-side power switch.

Clause 15—The system of clause 13 or 14, wherein the control unit is configured to disable the half-bridge in response to receiving an indication from either the first comparator or second comparator that either the low-side power switch or the high-side power switch is stuck in an ON state.

Clause 16—The system of any of clauses 13-15, wherein the control unit is configured to issue a maintenance alert for the system in response to receiving an indication of a fault from either the first comparator or the second comparator.

Clause 17—The system of any of clauses 13-16, wherein an absence of an expected logic signal from either the first comparator or the second comparator during a switching cycle indicates a fault.

Clause 18—The system of any of clause claim 13-17, further comprising a plurality of driver circuits configured to control a plurality of half-bridges, wherein the plurality of half-bridges is configured control a multi-phase electric motor.

Clause 19—The system of claim 18, the system further comprising the multi-phase electric motor.

Clause 20—A method of controlling a power switch, the method comprising: delivering signals to a gate of the power switch to control an ON/OFF state of the power switch; receiving a first threshold from a control unit to configure a comparator; comparing, via the comparator, a gate-to-source voltage of the power switch to the first threshold when the power switch is ON; receiving a second threshold from the control unit to configure the comparator, wherein the second threshold is different than the first threshold; and comparing, via the comparator, the gate-to-source voltage of the power switch to the second threshold when the power switch is OFF Clause 21—The method of clause 20, further comprising: outputting a first logic signal in response to the gate-to-source voltage being greater than the first threshold when the power switch is ON; and outputting a second logic signal in response to the gate-to-source voltage being less than the second threshold when the power switch is OFF.

Clause 22—The method of clause 21, wherein an absence of the first or second logic signal from the comparator during a switching cycle indicates a fault associated with the comparator.

Clause 23—The method of any of clauses 20-22, further comprising: receiving an indication of a first polarity to configure polarity of the comparator during an ON state of the power switch; and receiving an indication of a second polarity to configure polarity of the comparator during an OFF state of the power switch.

Various features and aspects have been described in this disclosure. These and other features and aspects are within the scope of the following claims.

The invention claimed is:

1. A driver circuit configured to control a power switch, the driver circuit comprising:
    an output pin configured to deliver signals to a gate of the power switch to control an ON/OFF state of the power switch; and
    a comparator configured to compare a gate-to-source voltage of the power switch to a first threshold when the power switch is ON and to compare the gate-to-source voltage of the power switch to a second threshold when the power switch is OFF, wherein an absence of a logic signal from the comparator during a switching cycle of the power switch indicates a fault associated with the comparator.

2. The driver circuit of claim 1, wherein the comparator is configurable with either the first threshold or the second threshold based on one or more control signals from a control unit.

3. The driver circuit of claim 1, wherein the comparator is configured to output a first logic signal in response to the gate-to-source voltage being greater than the first threshold when the power switch is ON and to output a second logic signal in response to the gate-to-source voltage being less than the second threshold when the power switch is OFF.

4. The driver circuit of claim 1, wherein the comparator is configured by the driver circuit based on control signals from a control unit to define a first polarity when the power switch is ON and to define a second polarity when the power switch is OFF, wherein the first polarity is different than the second polarity.

5. A driver circuit configured to control a high-side power switch and a low-side power switch arranged in a half-bridge, the driver circuit comprising:
    a first output pin configured to deliver high-side signals to
        a gate of the high-side power switch to control an ON/OFF state of the high-side power switch;
    a second output pin configured to deliver low-side signals to a gate of the low-side power switch to control an ON/OFF state of the low-side power switch;
    a first comparator configured to compare a gate-to-source voltage of the high-side power switch to a first threshold when the high-side power switch is ON and to compare the gate-to-source voltage of the high-side power switch to a second threshold when the high-side power switch is OFF; and a second comparator configured to compare a gate-to-source voltage of the low-side power switch to the first threshold when the low-side power switch is ON and to compare the gate-to-source voltage of the low-side power switch to the second threshold when the low-side power switch is OFF, wherein an absence of a first logic signal or a second logic signal from the first comparator during a switching cycle indicates a fault associated with the first comparator and wherein an absence of a third logic signal or a fourth logic signal from the second comparator during the switching cycle indicates a fault associated with the second comparator.

6. The driver circuit of claim 5, wherein the first and second comparators are each configurable with either the first threshold or the second threshold based on one or more control signals from a control unit.

7. The driver circuit of claim 5,
wherein the first comparator is configured to output the first logic signal in response to the gate-to-source voltage of the high-side power switch being greater than the first threshold when the high-side power switch is ON and to output h second logic signal in response to the gate-to-source voltage of the high-side power switch being less than the second threshold when the high-side power switch is OFF, and wherein the second comparator is configured to output the third logic signal in response to the gate-to-source voltage of the low-side power switch being greater than the first threshold when the low-side power switch is ON and to output h fourth logic signal in response to the gate-to-source voltage of the low-side power switch being less than the second threshold when the low-side power switch is OFF.

8. The driver circuit of claim 5, wherein the driver circuit is configured to turn the high-side power switch and the low-side power switch ON and OFF in a complementary fashion,
wherein the first comparator is configured by the driver circuit based on control signals from a control unit to define a first polarity when the high-side power switch is ON and to define a second polarity when the high-side power switch is OFF, wherein the first polarity is different than the second polarity, and wherein the second comparator is configured by the driver circuit based on control signals from the control unit to define the first polarity when the low-side power switch is ON and to define the second polarity when the low-side power switch is OFF.

9. The driver circuit of claim 5, further comprising a plurality of driver circuits configured to control a plurality of half-bridges.

10. The driver circuit of claim 9, wherein the plurality of half-bridges is configured to control a multi-phase electric motor.

11. A system comprising:
a control unit; and
a driver circuit configured to receive control signals from the control unit and to control a half-bridge based on the control signals, wherein the half-bridge includes a high-side power switch and a low-side power switch, the driver circuit comprising:

a first output pin configured to deliver high-side signals to a gate of the high-side power switch to control an ON/OFF state of the high-side power switch;

a second output pin configured to deliver low-side signals to a gate of the low-side power switch to control an ON/OFF state of the low-side power switch;

a first comparator configured to compare a gate-to-source voltage of the high-side power switch to a first threshold when the high-side power switch is ON and to compare the gate-to-source voltage of the high-side power switch to a second threshold when the high-side power switch is OFF; and a second comparator configured to compare a gate-to-source voltage of the low-side power switch to the first threshold when the low-side power switch is ON and to compare the gate-to-source voltage of the low-side power switch to the second threshold when the low-side power switch is OFF, wherein an absence of an expected logic signal from either the first comparator or the second comparator during a switching cycle indicates a fault.

12. The system of claim 11, further comprising the high-side power switch and the low-side power switch.

13. The system of claim 11, wherein the control unit is configured to disable the half-bridge in response to the fault.

14. The system of claim 11, wherein the control unit is configured to issue a maintenance alert for the system in response to the fault.

15. The system of claim 11, further comprising a plurality of driver circuits configured to control a plurality of half-bridges, wherein the plurality of half-bridges is configured to control a multi-phase electric motor.

16. The system of claim 15, further comprising the multi-phase electric motor.

17. A method of controlling a power switch, the method comprising:
delivering signals to a gate of the power switch to control an ON/OFF state of the power switch;
receiving a first threshold from a control unit to configure a comparator;
comparing, via the comparator, a gate-to-source voltage of the power switch to the first threshold when the power switch is ON;
receiving a second threshold from the control unit to configure the comparator, wherein the second threshold is different than the first threshold; and
comparing, via the comparator, the gate-to-source voltage of the power switch to the second threshold when the power switch is OFF,
wherein an absence of a first or second logic signal from the comparator during a switching cycle indicates a fault associated with the comparator.

18. The method of claim 17, further comprising:
outputting the first logic signal in response to the gate-to-source voltage being greater than the first threshold when the power switch is ON; and
outputting the second logic signal in response to the gate-to-source voltage being less than the second threshold when the power switch is OFF.

19. The method of claim 17, further comprising:
receiving, from a control unit, an indication of a first polarity to configure a polarity of the comparator during an ON state of the power switch; and receiving, from the control unit, an indication of a second polarity to configure the polarity of the comparator during an OFF state of the power switch.

\* \* \* \* \*